United States Patent [19]

Jones et al.

[11] Patent Number: 5,031,689
[45] Date of Patent: Jul. 16, 1991

[54] FLEXIBLE THERMAL APPARATUS FOR MOUNTING OF THERMOELECTRIC COOLER

[75] Inventors: Jack A. Jones, Los Angeles; S. Walter Petrick, La Canada; Steven Bard, Northridge, all of Calif.

[73] Assignee: The United States of America as represented by the Administrator of the National Aeronautics and Space Administration, Washington, D.C.

[21] Appl. No.: 560,908

[22] Filed: Jul. 31, 1990

[51] Int. Cl.$^5$ .............................................. F28F 7/00
[52] U.S. Cl. ...................................... 165/1; 165/185; 136/204
[58] Field of Search .................. 165/80.2, 80.3, 185, 165/1; 174/16.3; 357/81; 361/386, 388, 389; 62/3.1, 3.7; 136/200, 203, 204

[56] References Cited

U.S. PATENT DOCUMENTS

| | | | |
|---|---|---|---|
| 3,244,224 | 4/1966 | Hnilicka, Jr. ................... | 165/32 HV |
| 3,332,807 | 7/1967 | Boehmer et al. .................... | 136/203 |
| 3,337,309 | 8/1967 | Lewis et al. ...................... | 136/230 X |
| 3,412,566 | 11/1968 | Townsend et al. ............... | 136/212 X |
| 3,449,172 | 6/1969 | Dingwall ............................ | 165/185 |
| 3,482,198 | 12/1969 | Hopper, Jr. ...................... | 361/386 X |
| 3,804,676 | 4/1974 | Sell, Jr. ............................. | 136/205 |
| 3,969,149 | 7/1976 | Thomas et al. .................... | 136/225 |
| 4,273,183 | 6/1981 | Altoz et al. ........................ | 165/32 |
| 4,410,756 | 10/1983 | Schwagerman .................... | 136/221 |
| 4,465,895 | 8/1984 | Verner et al. ...................... | 136/225 |
| 4,869,068 | 9/1989 | Van Volten ....................... | 62/51.1 |
| 4,873,843 | 10/1989 | Van Volten ....................... | 62/51.1 |

OTHER PUBLICATIONS

"Thermoelectric Cooler", Pesco Products Div. of Borg-Warnes, Model 094492-010.

*Primary Examiner*—Allen J. Flanigan
*Attorney, Agent, or Firm*—Thomas H. Jones; Harold W. Adams; John R. Manning

[57] ABSTRACT

A flexible heat transfer apparatus used to flexibly connect and thermally couple a thermoelectric cooler to an object to be cooled. The flexible heat transfer apparatus consists of a pair of flexible corrugated sheets made from high thermal conductivity materials such as copper, aluminum, gold, or silver. The ridges of the corrugated sheets are oriented perpendicular to one another and bonded sandwich-fashion between three plates to define an upper section and a lower section. The upper section provides X flexure, the lower section provides Y flexure, and both sections together provide Z flexure.

10 Claims, 1 Drawing Sheet

FLEXIBLE THERMAL APPARATUS FOR MOUNTING OF THERMOELECTRIC COOLER

ORIGIN OF THE INVENTION

The invention described herein was made in the performance of work under a NASA contract, and is subject to the provisions of Public Law 96-517 (35 U.S.C. Section 202) in which the Contractor has elected not to retain title.

TECHNICAL FIELD

This invention relates generally to flexible heat transfer structures and, more specifically, to a flexible thermal mounting apparatus for use between a thermoelectric cooler and an object to be cooled.

BACKGROUND ART

In a preferred embodiment, the present invention is intended to be used with thermoelectric coolers (TECs). The theory of operation behind TECs is well known and does not form a material part of the present invention, and therefore will not be covered in great detail herein. Suffice it to say that TECs are solid state devices that use the cooling effect caused by applying a voltage differential across two dissimilar, joined metals. A TEC is generally divided into a top stage and a bottom stage. When the top stage is cooled, the bottom stage is heated such that there are net differential expansions created in the TEC relative to its external surroundings. Because TECs are relatively fragile and subject to contact with its surroundings so that it is protected from external loading due to thermal expansion and/or externally applied loads.

In the prior art, such stress protection has been achieved with very expensive devices known as thermal straps. The prior art thermal straps are typically fabricated from expensive, flexible woven silver fabric material. These woven silver thermal straps are very expensive because of the need for complicated assembly fixtures, as well as the need for assembly techniques such as custom vacuum electron-beam welding. Moreover, the thermal resistance of the woven silver thermal straps is relatively high, typically in the neighborhood of 10° C. temperature increase for each watt of heat transmitted through the thermal strap.

STATEMENT OF THE INVENTION

It is an object of the present invention to provide a flexible thermal transfer apparatus that solves the above-mentioned problems in the prior art;

It is a further object of the present invention to provide a flexible thermal transfer apparatus that is simple to fabricate and relatively inexpensive to construct;

It is a further object of the present invention to provide a flexible thermal transfer apparatus having a relatively low thermal resistance characteristic; and It is a further object of the present invention to provide a thermal transfer apparatus that is flexible in all three orthogonal directions.

The present invention achieves the above objects by providing a flexible heat transfer apparatus for conducting heat between a source object and a sink object, the apparatus comprising a plurality of heat conductive plates being arranged relative to one another such that at least one planar side of each plate is adjacent to at least one planar side of another plate, one of said plates being bonded to the source object and another said plate being bonded to the sink object; and at least one flexible heat conductive means located between said heat conductive plates, said heat conducting means being flexible in at least one direction relative to said heat conductive plates. In the preferred embodiment, there are three heat conductive plates, and the flexible heat conductive means is comprised of a pair of orthogonally oriented sinusoidally corrugated heat conductive sheets.

BRIEF DESCRIPTION OF THE DRAWINGS

The just-summarized invention will now be described in detail in conjunction with the drawings of which.

DETAILED DESCRIPTION OF THE INVENTION

Figure 1:
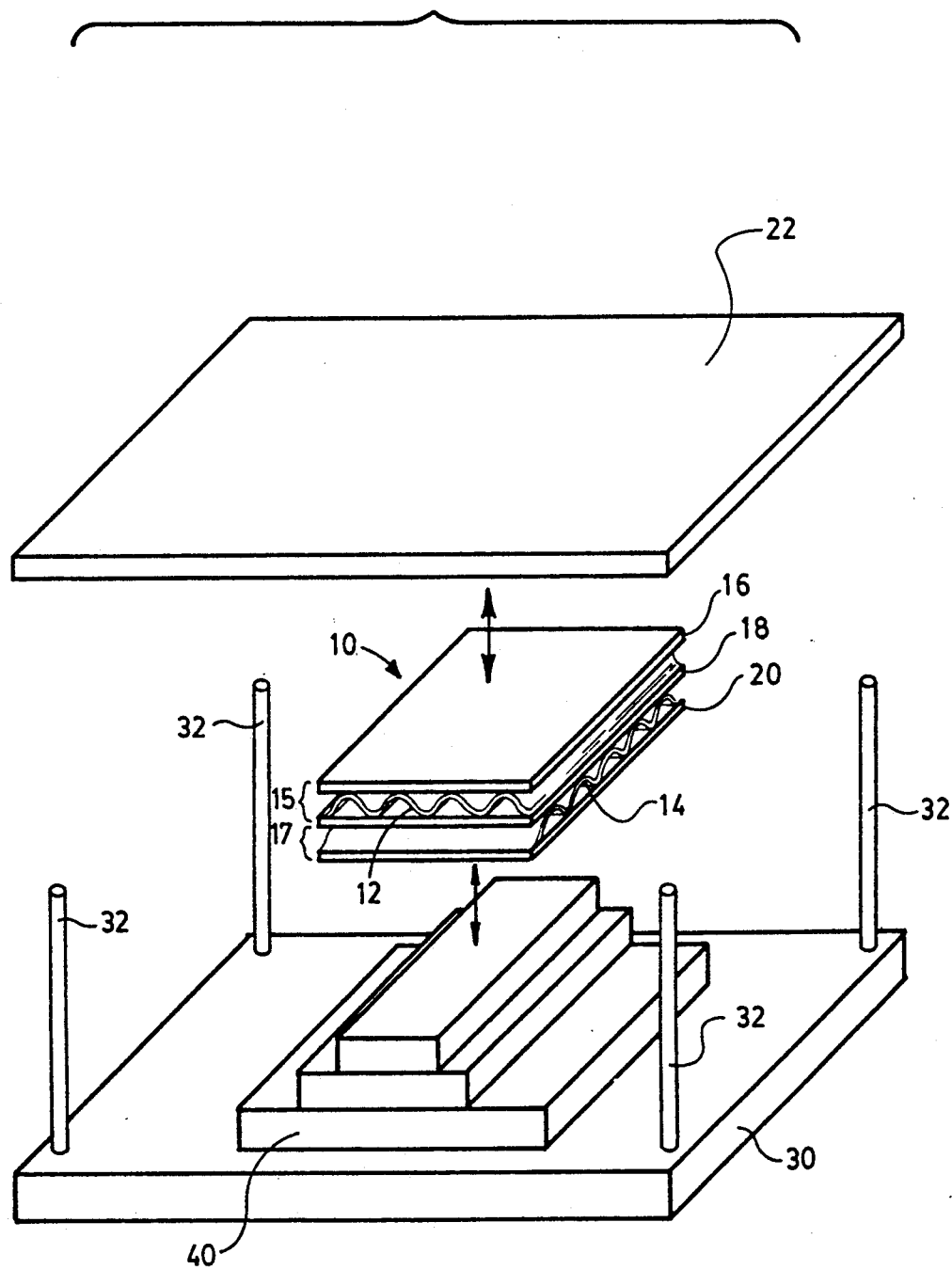
FIG. 1 is a perspective view of the preferred flexible heat transfer apparatus according to the present invention as used with a thermoelectric cooler 40 and an object to be cooled 20.

A preferred flexible heat transfer apparatus 10 according to the present invention is illustrated in FIG. 1. As shown, the flexible heat transfer apparatus 10 is comprised of a pair of flexible heat conductive means 12, 14 that are sandwiched or bonded between a plurality of heat conductive plates 16, 18, 20. The preferred flexible heat conductive means 12, 14 illustrated in FIG. 1 are comprised of sinusoidally corrugated sheets of high heat conduction, thin, flexible foil such as copper, aluminum, gold, or silver. Other types of materials and/or geometries are, of course, suitable as said flexible heat conductive means 12, 14.

The flexible corrugated heat conductive sheets 12, 14 are bonded between the plurality of heat conductive plates 16, 18, 20 so as to define an upper section 15 and a lower section 17. A corrugated sheet 12, 14 may be formed by placing consecutive cylindrical pins onto alternate sides of a flat sheet, bonding the resulting corrugated ridges to the heat conductive plates, and then removing the cylindrical pins. In the upper section 15, the ridges of the first flexible corrugated heat conductive sheet 12 are bonded to the underside of the first heat conductive plate 16 and the top side of the second heat conductive plate 18. The lower section 17 is similarly formed by having the ridges of corrugated sheet 14 bonded to the underside and top side of heat conductive plates 18 and 20, respectively. The upper section 15 and the lower section 17 are formed such that the ridges or corrugations of the corrugated sheets 12 and 14 are oriented orthogonally with respect to one another.

In this fashion, the upper section 15 can flex left and right, while the lower section 17 can flex back and forth. The just-detailed operation of the upper and lower sections 15, 17 provides the needed X, Y flexure components. The Z flexure component is provided by the up/down deformation that can occur in the sinusoidal corrugations of both corrugated sheets 12 and 14.

FIG. 1 further illustrates the intended placement of the flexible thermal transfer apparatus 10 between a thermoelectric cooler 40 and an object to be cooled 22. The illustrated thermoelectric cooler 40 is a three-stage unit. The exact structure of the thermoelectric cooler is, however, immaterial to the present invention. The thermoelectric cooler 40 is mounted and/or otherwise suitably bonded to a heat sink base 30. Thermally insulated standoffs 32 extend upward from the heat sink base 30 in order to substantially support the object to be cooled 22. The standoffs 32 are needed because the flexible thermal transfer apparatus 10 is not intended to support the object to be cooled 22, but rather simply to provide a heat transfer path therebetween.

The underside of heat conductive plate 20 is bonded to the top side of thermoelectric cooler 40, while the top side of heat conductive plate 16 is bonded to the underside of the object to be cooled 22. In this fashion, the flexible thermal transfer apparatus 10 provides an inexpensive heat transmission strap between the object to be cooled 22 and the thermoelectric cooler 40. The apparatus 10 allows for heat transfer, while simultaneously providing for flexibility in all three orthogonal directions.

A thermal heat transfer apparatus according to the present invention is particularly desirable because of the high level of thermal conductivity that may be achieved. It is possible to achieve a thermal resistance as low as 1° C. per watt of heat transmitted. Such high thermal conductivity makes the device particularly suitable for use with fragile aerospace components, because high thermal loads may be transmitted without stress load transmission.

In the preferred embodiment, a thermal resistance of 1° C./watt has been achieved, where heat conductive plates 16, 18, 20 are comprised of 1.2-inch thick square copper plates, and the corrugated heat conductive sheets 12 and 14 are comprised of 0.001-inch thick silver foil that was processed to have 3/32-inch diameter corrugations. It is believed that even higher thermal conductivity may be achieved by varying the dimensions and/or materials used.

Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

We claim:

1. A flexible heat transfer apparatus for conducting heat between a source object and a sink object comprising:
    a plurality of heat conductive plates, said plates being arranged relative to one another such that at least one planar side of each plate is adjacent to at least one planar side of another plate, one of said plates being bonded to the source object and another of said plates being bonded to the sink object; and
    at least one flexible heat conductive means located between said heat conductive plates, said heat conducting means being flexible in at least one direction relative to said heat conductive plates,
    wherein the number of said plurality of heat conductive plates is three, the first plate being bonded to said source object, the third plate being bonded to said sink object, and the second plate being located therebetween; and
    wherein the number of said flexible heat conductive means is two, said flexible heat conductive means being comprised of first and second flexible corrugated heat-conductive sheets, the ridges of the first flexible corrugated sheet being bonded between the first and second plates in a first orientation and the ridges of the second corrugated sheet being bonded between the second and third plates in a second orientation that is perpendicular to said first orientation.

2. The flexible heat transfer apparatus of claim 1 wherein said corrugated heat-conductive sheets are comprised of sinusoidal corrugations.

3. The flexible heat transfer apparatus of claim 1 wherein flexible corrugated heat-conductive sheets are comprised of a metal selected from the group consisting of copper, aluminum, gold, and silver.

4. The flexible heat transfer apparatus of claim 1 wherein said sink object is a thermoelectric cooler.

5. An apparatus for providing heat transfer between a thermoelectric cooler and an object to be cooled while compensating for vibrations and movement therebetween in all three orthogonal directions, comprising:
    first, second, and third heat-conductive plates arranged in a vertical stack such that at least one planar side of each plate is adjacent to at least one planar side of another plate, said first plate being bonded to said object to be cooled, said third plate being bonded to said thermoelectric cooler, and said second plate located therebetween; and
    first and second flexible corrugated heat-conductive sheets, the ridges of said first flexible corrugated sheet being bonded between said first and second plates in a first orientation and the ridges of said second corrugated sheet being bonded between said second and third plates in a second orientation that is perpendicular to said first orientation.

6. The apparatus of claim 5 wherein said corrugated heat-conductive sheets are comprised of sinusoidal corrugations.

7. The apparatus of claim 5 wherein said corrugated heat-conductive sheets are comprised of a metal selected from the group consisting of copper, aluminum, gold, and silver.

8. A method of thermally coupling a thermolectric cooler to an object to be cooled comprising the step of bonding therebetween a flexible apparatus comprising;
    a plurality of heat conductive plates, said plates being arranged relative to one another such that at least one planar side of each plate is adjacent to at least one planar side of another plate, one of said plates being bonded to the thermoelectric cooler and another of said plates being bonded to the object to be cooled; and
    at least one flexible heat conductive means located between said heat conductive plates, said heat conducting means being flexible in at least one direction relative to said heat conductive plates;
    the number of said plurality of heat conductive plates is three, the first plate being bonded to said object to be cooled, the third plate being bonded to said thermoelectric cooler, and the second plate being located therebetween; and
    the number of said flexible heat conductive means is two, said flexible heat conductive means being comprised of first and second flexible corrugated heat-conductive sheets, the ridges of the first flexible corrugated sheet being bonded between thje first and second plates in a first orientation and the ridges of the second corrugated sheet being bonded between the second and third plates in a second orientation that is perpendicular to said first orientation.

9. The method of claim 8 wherein said corrugated heat-conductive sheets are comprised of sinusoidal corrugations.

10. The method of claim 8 wherein said flexible corrugated heat-conductive sheets are comprised of a metal selected from the group consisting of copper, aluminum, gold, and silver.

* * * * *